(12) United States Patent
Yamaguchi

(10) Patent No.: US 6,314,543 B1
(45) Date of Patent: Nov. 6, 2001

(54) METHOD OF PLACING MARKS FOR ALIGNMENT ACCURACY MEASUREMENT

(75) Inventor: Akira Yamaguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/238,884

(22) Filed: Jan. 28, 1999

(30) Foreign Application Priority Data

Jan. 30, 1998 (JP) .................................................. 10-018876

(51) Int. Cl.[7] ...................................................... G06F 17/50
(52) U.S. Cl. .................................................. 716/1; 716/19
(58) Field of Search ........................................... 716/1, 19

(56) References Cited

U.S. PATENT DOCUMENTS

| | | | |
|---|---|---|---|
| 5,561,606 | * | 10/1996 | Ota et al. ................................ 716/19 |
| 5,805,866 | * | 9/1998 | Magome et al. ........................ 716/19 |
| 6,216,252 | * | 4/2001 | Dangelo et al. ......................... 716/1 |

* cited by examiner

*Primary Examiner*—Trong Phan
(74) *Attorney, Agent, or Firm*—Oblon, Spivak, McClelland, Maier & Neustadt, P.C.

(57) ABSTRACT

This invention provides a method of placing marks for alignment accuracy measurement in which measurement marks for pattern dimensional accuracy and positioning accuracy are added to and placed in an inner chip region of an LSI and which can be standardized easily. In designing an LSI, e.g., an ASIC, by using automatic placing and routing CAD, measurement marks for dimensional accuracy and positioning accuracy are automatically placed in an inner circuit, which includes a mega-cell and a primitive cell, without requiring a man-machine interactive operation, to standardize measurement and shorten the development time. The measurement marks are placed in the mega-cell and primitive cell. Alternatively, an independent primitive cell comprising a measurement mark is prepared in a primitive cell library. The measurement marks or the independent primitive cell is automatically placed by using automatic placing and routing CAD, thereby dispersedly placing the measurement marks in the inner chip region of the LSI. A plurality of measurement marks for measuring dimensional accuracy and positioning accuracy are added to the chip in this manner, so that an LSI having a high yield and high reliability can be manufactured at a low cost.

18 Claims, 5 Drawing Sheets

METHOD OF PLACING MARKS FOR ALIGNMENT ACCURACY MEASUREMENT

BACKGROUND OF THE INVENTION

The present invention relates to a method of placing marks for alignment accuracy measurement and, more particularly, to a method of placing marks for alignment accuracy measurement in an LSI chip by means of automatic placing and routing CAD (Computer Aided Design) program.

Conventionally, a method has been employed, in which measurement marks for evaluating pattern dimensional accuracy and positioning accuracy are formed, together with a TEG (Test Element Group) for process evaluation, in the peripheral region of the LSI chip in order to measure the dispersion of the dimensional accuracy or displacement of position of the pattern layout of the LSI.

As an example, FIG. 1 schematically shows the pattern layout of an LSI in which a plurality of mega-cells 1, e.g., an arithmetic logic unit and a memory unit, and their peripheral logic circuits (not shown) are placed in an inner chip region 17, and chip peripheral I/O and TEG regions 18, 18a have input and output wiring and process evaluation TEGs 20.

In order to realize high integration of LSIs, the inner circuit comprising the mega-cells 1 and their peripheral logic circuits is usually placed without open spaces as much as possible by using the automatic placing and routing CAD program. Regarding this, the wiring of the I/O region 18, comprising input and output data buses on the peripheral region of the chip, must be routed around in accordance with the package shape and pin configuration, usually resulting in a layout having open spaces.

In order to manufacture an LSI, evaluation of the completeness of interlayer insulation, the contact yield of connections such as contact holes or the like, and evaluation of the partial circuit including transistors must be performed in the manufacturing process. Portions that perform these evaluations are included in the chip peripheral I/O and TEG regions 18, 18a as process evaluation TEGs 20 shown in FIG. 1.

An LSI requires ten-odd times of mask alignment operation in lithography. A high manufacturing yield is assured by evaluating the pattern dimensional accuracy and interlayer positioning accuracy in mask pattern printing process. In order to evaluate the dimensional accuracy and positioning accuracy, a measurement mark block 2 usually comprising a plurality of measurement marks is necessary. The measurement mark block 2 usually changes depending on the mask pattern layers, and different types of marks are used for different LSI functions.

Concerning the dimensional accuracy and positioning accuracy of the LSI pattern layout, in recent years, along with the progress in LSI products in the deep submicron region, dimensional and positioning dispersions of not only the I/O and TEG regions 18, 18a in the chip peripheral region but also the inner circuit placed in the inner chip region 17 have great importance. For this reason, a plurality of measurement marks must be dispersedly placed in the inner chip region 17 in accordance with some method.

As described above, it is not conventionally intended to include exclusive measurement marks for pattern dimensional accuracy and positioning accuracy in the inner chip region 17 of a logic LSI with an irregular pattern layout. Accordingly, the dimensional and positioning dispersions of the LSI pattern placed in the inner chip region 17 are conventionally evaluated by using part of the LSI pattern in place of a measurement mark.

In an actual LSI, its pattern and layout are complicated, and the pattern dependence, proximity effect, and the like are complicatedly related to errors in pattern dimension and position. With the method of using part of the LSI pattern in place of the measurement mark, errors in pattern dimension and position cannot be measured with high precision.

With this conventional method, the layout designer selects part of the LSI pattern as the measurement mark by a manual operation, and the measurement operator measures a pattern selected as the measurement mark, which changes for each time of measurement. Accordingly, it is very difficult to make standardization of measuring operation, leading to measurement errors.

Conventionally, an attempt has also been performed to improve the measurement accuracy of dimension and position of the LSI pattern layout by placing exclusive measurement marks in the logic LSI chip. In this case, when the automatic placing and routing CAD procedure of the logic LSI is ended, the measurement marks are placed by searching open spaces in the chip appropriate for including the measurement marks by a manual operation.

Since this method is performed after the automatic placing and routing CAD procedure, the presence of the open spaces in the chip appropriate for including the measurement marks cannot be guaranteed in advance. If the appropriate open spaces are not present, the automatic placing and routing CAD procedure of the logic LSI must be performed again by the man-machine interactive operation, to forcedly place the open spaces for the measurement marks in the LSI pattern layout.

In this case, since the man-machine interactive operation leaves arbitrariness, standardization of measurement of the dimensional accuracy and positioning accuracy of the LSI pattern layout becomes difficult, causing measurement errors, longer development time, and increasing the cost.

BRIEF SUMMARY OF THE INVENTION

As described above, in the conventional method of placing marks for alignment accuracy measurement in the LSI chip, since the man-machine interactive operation leaves arbitrariness, standardization of measurement of the dimensional accuracy and positioning accuracy is difficult, causing measurement errors, longer development time, and increasing the cost.

The present invention has been made to solve the above problem, and has as its object to provide a method of placing and adding marks for alignment accuracy measurement in an inner LSI chip, in which the man-machine interactive operation is eliminated to facilitate standardization of measurement of the dimensional accuracy and positioning accuracy, and an LSI pattern formed by using this method.

The characteristic feature of the method of placing marks for alignment accuracy measurement in an LSI chip according to the present invention resides in that, in pattern design such as an ASIC (Application Specific Integrated Circuit) using automatic placing and routing CAD in the deep submicron region, measurement marks for dimensional accuracy and positioning accuracy are automatically placed and added as required not only in peripheral I/O and TEG regions but also in an inner circuit comprising mega-cells and primitive cells, thereby standardizing measurement, shortening the development time, and decreasing the cost.

More specifically, according to the present invention, there is provided, in creating a pattern layout of an LSI including at least one mega-cell placed in an inner region of a semiconductor chip and a chip peripheral region, a method of placing marks for alignment accuracy measurement, comprising the steps of placing, in the mega-cell, a measurement mark for measuring at least one of pattern dimensional accuracy and pattern positioning accuracy, adding the mega-cell to the inner region of the semiconductor chip, and automatically placing the mega-cell in the inner region of the semiconductor chip by automatic placing and routing means.

According to the present invention, there is also provided, in creating a pattern layout of an LSI including a plurality of primitive cells comprising several types of gate circuits placed in an inner region of a semiconductor chip and a chip peripheral region, a method of placing marks for alignment accuracy measurement, comprising the steps of placing a measurement mark for measuring at least one of pattern dimensional accuracy and pattern positioning accuracy, in a primitive cell comprising at least one type of gate circuit among the several types of gate circuits, adding the primitive cell to the inner region of the semiconductor chip, and automatically placing the primitive cell in the inner region of the semiconductor chip by automatic placing and routing means.

According to the present invention, there is also provided, in creating a pattern layout of an LSI including at least one mega-cell placed in an inner region of a semiconductor chip, a plurality of primitive cells comprising several types of gate circuits placed in the inner region of the semiconductor chip, and a chip peripheral region, a method of placing marks for alignment accuracy measurement, comprising the steps of placing, in the mega-cell, a first measurement mark for measuring at least one of pattern dimensional accuracy and pattern positioning accuracy, placing a second measurement mark for measuring at least one of pattern dimensional accuracy and pattern positioning accuracy, in a primitive cell comprising at least one type of gate circuit among the several types of gate circuits, and adding the mega-cell and the primitive cell to the inner region of the semiconductor chip and automatically placing the primitive cell and the mega-cell in the inner region of the semiconductor chip by automatic placing and routing means.

Preferably, a region in the primitive cell where the measurement mark is to be placed is adjacent to a circuit pattern that forms the gate circuit and is placed among a plurality of power source metallization patterns of the gate circuit (e.g., between $V_{SS}$ and $V_{DD}$).

According to the present invention, there is also provided, in creating a pattern layout of an LSI including a plurality of primitive cells comprising several types of gate circuits placed in an inner region of a semiconductor chip and a chip peripheral region, a method of placing marks for alignment accuracy measurement, comprising the steps of defining a measurement mark for measuring at least one of pattern dimensional accuracy and pattern positioning accuracy, as one independent primitive cell in automatic placing and routing means, adding the independent primitive cell to the inner region of the semiconductor chip, and automatically placing the independent primitive cell and the plurality of primitive cells in the inner region of the semiconductor chip by automatic placing and routing means.

According to the present invention, there is also provided, in creating a pattern layout of an LSI including at least one mega-cell placed in an inner region of a semiconductor chip, a plurality of primitive cells comprising several types of gate circuits placed in the inner region of the semiconductor chip, and a chip peripheral region, a method of placing marks for alignment accuracy measurement, comprising the steps of placing, in the mega-cell, a first measurement mark for measuring at least one of pattern dimensional accuracy and pattern positioning accuracy, adding this mega-cell to the inner region of the semiconductor chip, and adding a second measurement mark for measuring at least one of pattern dimensional accuracy and pattern positioning accuracy to the inner region of the semiconductor chip as one independent primitive cell in automatic placing and routing means and automatically placing the independent primitive cell, the plurality of primitive cells, and the mega-cell in the inner region of the semiconductor chip by the automatic placing and routing means.

Preferably, metallization patterns to be connected to a plurality of power source metallization patterns of the several types of gate circuits are included in the independent primitive cell comprising the second measurement mark, and the measurement mark is placed among the metallization patterns (e.g., between $V_{SS}$ and $V_{DD}$).

An LSI pattern according to the present invention is characterized in that one of the measurement mark and first and second measurement marks is added to the inner region of the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be described in detail with reference to the accompanying drawing.

As described above, the gist of the present invention is to provide a method of automatically including measurement marks in the inner chip region of an LSI without requiring a man-machine interactive operation. An LSI chip layout is constituted by a chip peripheral region layout including I/O and an inner chip region layout, and the inner chip region layout is constituted by a plurality of mega-cells and a large number of primitive cells. When these cells are placed in the inner chip region and the placed cells are connected to each other with wiring metallization layers, a desired system function is realized.

Figure 1:
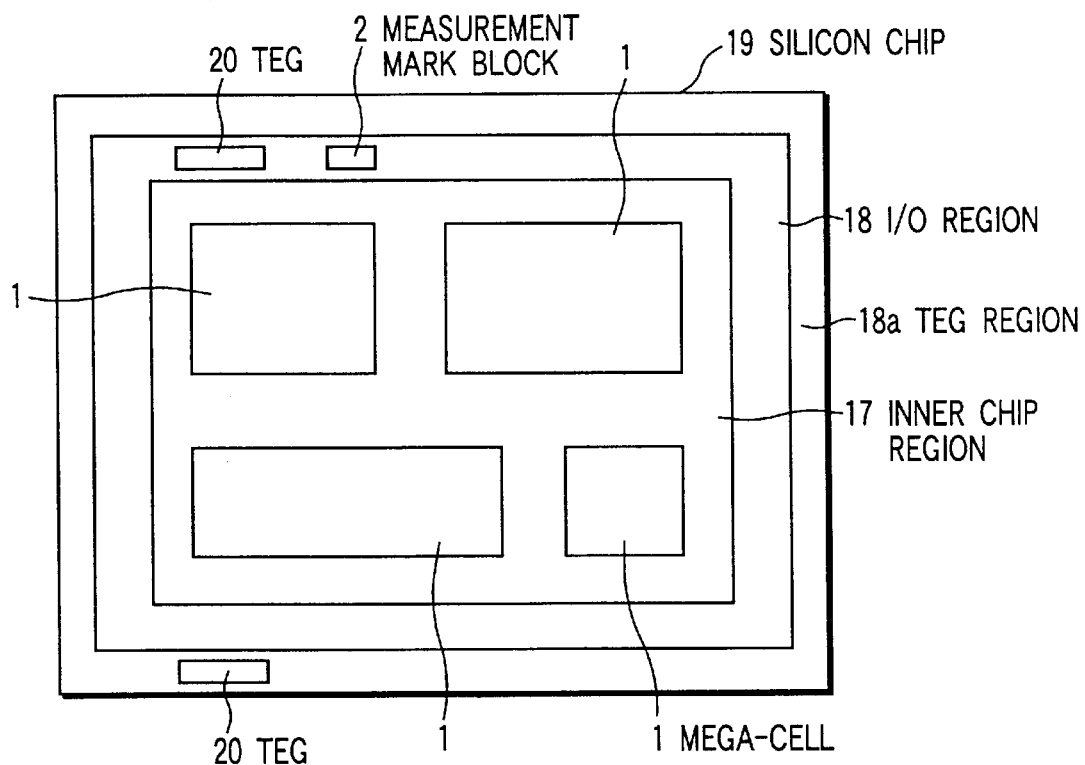
FIG. 1 is a view showing the pattern layout of an LSI having a measurement mark block in peripheral I/O and TEG regions and including conventional mega-cells.
Figure 2:
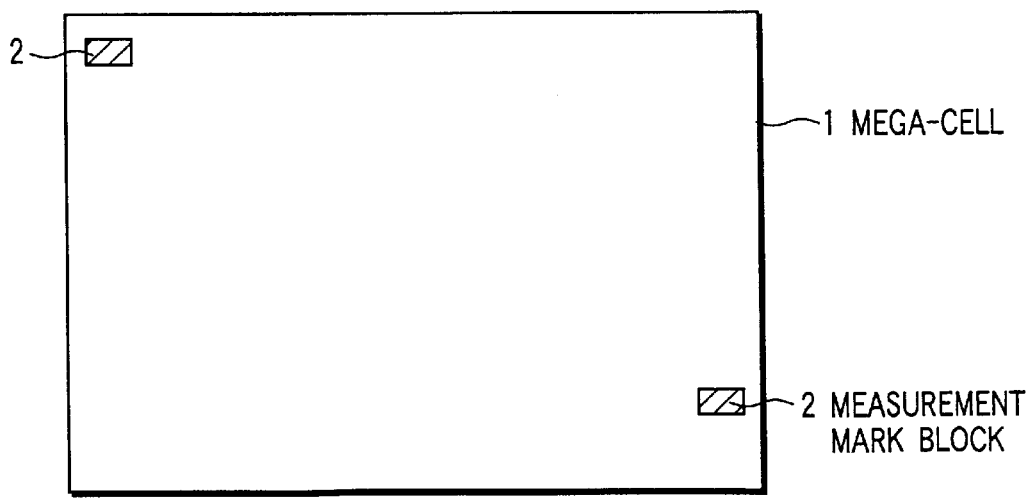
FIG. 2 is a view showing a mega-cell having measurement mark blocks according to the first embodiment of the present invention.

FIG. 2 is a view showing a method of placing measurement marks according to the first embodiment of the present invention. A mega-cell 1 comprises an arithmetic logic unit, a memory unit, and the like. Measurement mark blocks 2 are placed in this mega-cell 1.

As a method of not only forming a measurement mark block in a chip peripheral region in the conventional manner but also automatically adding measurement marks in the LSI inner chip region, first, the layouts of the measurement mark blocks 2 must always be included on the layout of the mega-cell 1 exceeding a predetermined size.

The size of the mega-cell 1 where the measurement mark blocks 2 are to be included is selected within such a range that inclusion of the layouts of the measurement mark blocks 2 does not largely influence the integration density of the entire LSI.

As explained earlier, with the method of adding the marks for alignment accuracy measurement in the chip according to the present invention, the measurement mark block which is conventionally placed in only the chip peripheral region is dispersedly placed in the LSI pattern in the inner chip region by executing the automatic placing and routing program, without requiring a man-machine interactive operation. When the mega-cell 1 where the measurement mark blocks 2 are placed, and the primitive cell are automatically placed in the LSI pattern in the manner as described above, the measurement mark blocks 2 are automatically and dispersedly placed in the LSI pattern simultaneously.

Each measurement mark block 2 may be constituted by a plurality of marks conventionally placed in the chip peripheral region to measure dimensional accuracy and positioning accuracy of the pattern layout, or may be a single mark having the two functions of dimensional accuracy measurement and positioning accuracy measurement. The pattern layout of the mark may be changed in units of the mask pattern layers forming the mega-cell 1 in accordance with the function and integration level of the mega-cell 1. The measurement mark blocks 2 may also be formed in the chip peripheral region, or may be placed only in the mega-cell 1 and dispersedly placed in the LSI pattern.

Figure 3:
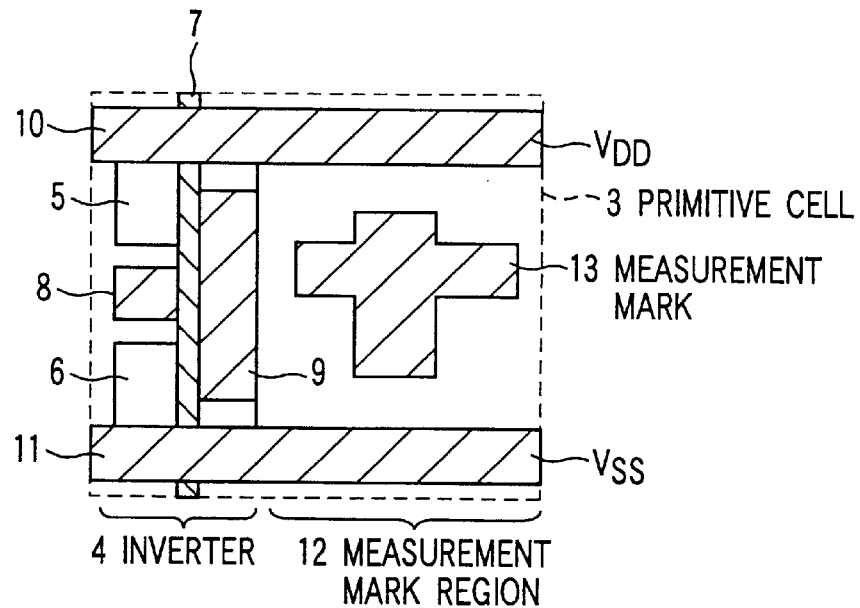
FIG. 3 is a view showing a primitive cell including an inverter and a measurement mark according to the second embodiment of the present invention.

A method of placing marks for alignment accuracy measurement according to the second embodiment of the present invention will be described with reference to FIG. 3. The pattern layout of the second embodiment shown in FIG. 3 is constituted by a primitive cell 3 comprising an inverter 4 and a measurement mark region 12. The inverter 4 is constituted by a p-type diffusion layer 5, an n-type diffusion layer 6, and a polysilicon 7 for a gate electrode, and patterns that respectively form an input metallization 8, an output metallization 9, a $V_{DD}$ power source metallization 10, and a $V_{SS}$ power source metallization 11. The measurement mark region 12 is formed in the primitive cell 3 together with the inverter 4, and a measurement mark 13 is included in the measurement mark region 12.

In the example shown in FIG. 3, the measurement mark 13 is placed between the $V_{DD}$ power source metallization 10 and $V_{SS}$ power source metallization 11. However, the measurement mark 13 need not always be placed between power source metallizations.

The inverter 4 shown in FIG. 3 comprises a complementary MOSFET, as will be described later. As an open space where the measurement mark 13 is to be placed adjacent to the inverter 4, the space between the $V_{DD}$ power source metallization 10 and $V_{SS}$ power source metallization 11 is optimum. However, if another circuit form and another primitive cell shape are employed, the space between the power source metallizations is not always the optimum place to include a measurement mark.

A primitive cell is a cell which, as compared to a functional block such as a mega-cell, includes the basic gate of a unit function such as an inverter, a NAND gate, a NOR gate, or a flip-flop circuit. Primitive cells are formed into a cell library in this manner, and serve as the constituent elements of a cell-base system with which a chip is usually designed in a cell array form.

Figure 4:
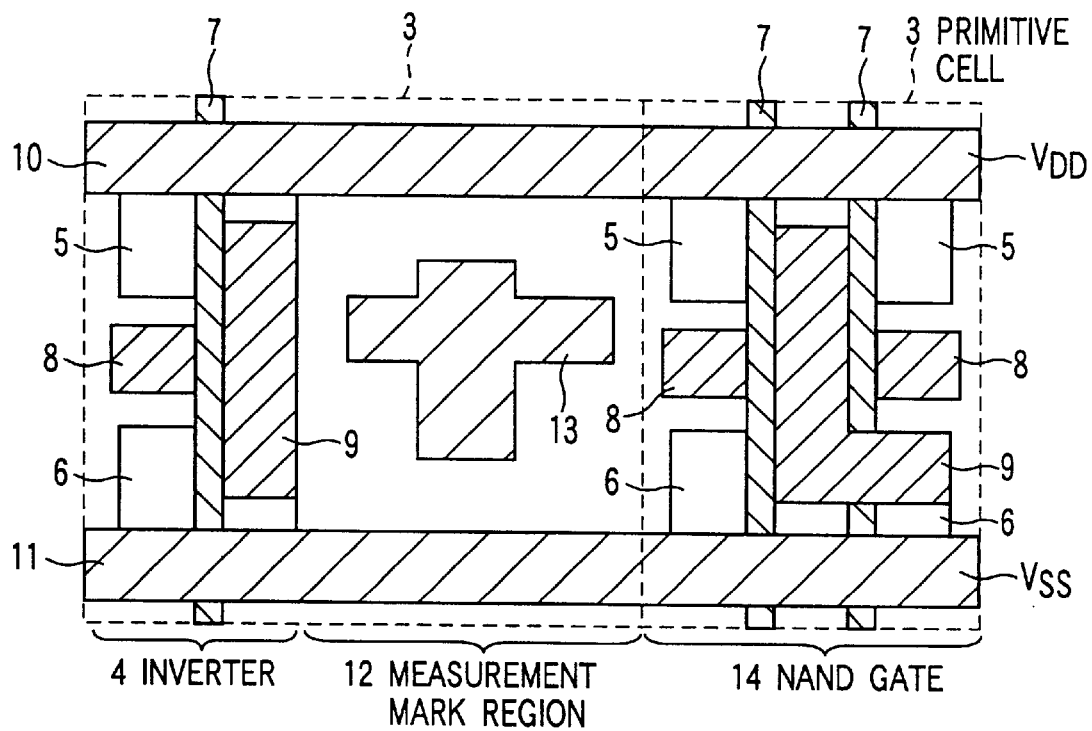
FIG. 4 is a view showing a state wherein the primitive cell according to the second embodiment is placed adjacent to a primitive cell comprising a NAND gate.

FIG. 4 shows a state wherein the primitive cell 3, comprising the inverter 4 and the measurement mark region 12 including the measurement mark 13 shown in FIG. 3, and another primitive cell 3 comprising only a NAND gate 14 are automatically placed adjacent to each other.

It is not necessary to include the measurement mark 13 in all types of basic gates serving as the constituent elements of the cell library. If pattern designing of an LSI by automatic placing and routing CAD is performed by including the measurement mark 13 in only the inverter 4 having a small occupation area, as shown in FIG. 4, then a measurement mark can be placed in the inner chip region without excessively decreasing the integration density of the entire LSI. Of the many types of basic gates, which primitive cell is to include the measurement mark 13 is determined in accordance with the integration level of the target LSI and required functions.

When the primitive cell 3 including the measurement mark 13, and mega-cells 1 are automatically placed in the inner chip region by using automatic placing and routing CAD, the measurement marks 13 that are placed in the primitive cell 3 are automatically and dispersedly placed in the LSI pattern in the inner chip region designed according to the cell-base system simultaneously.

Each measurement mark 13 may be constituted by a plurality of marks, or may be a single mark. The pattern shape of the mark may be changed in units of the mask pattern layers forming the primitive cell 3. The measurement mark blocks 2 may also be formed in the chip peripheral region, as in the conventional manner, or may be included only in the primitive cell 3 and dispersedly placed in the LSI pattern of the inner chip region.

A method of placing marks for alignment accuracy measurement according to the third embodiment of the present invention will be described. An LSI according to the method of placing marks for alignment accuracy measurement according to the third embodiment comprises a chip peripheral region and an inner circuit, and the inner circuit comprises mega-cells and primitive cells. In the LSI inner region, the mega-cells form functional blocks, and a group of primitive cells usually form the peripheral circuit of the mega-cells. A partial group of the primitive cells may form another functional block.

In this mixed primitive cell LSI of mega-cell system, when the measurement mark blocks 2 described in the first embodiment are placed in the mega-cells 1, and the measurement mark 13 described in the second embodiment is placed in the primitive cell of a specific type of basic gate and is automatically placed in the LSI pattern by using automatic placing and routing CAD, the measurement mark blocks 2 and measurement mark 13 are automatically and dispersedly placed in the inner chip region simultaneously. With this method, the measurement marks can be placed in the mega-cell region reliably, and in the primitive cell region automatically and dispersedly at a certain ratio.

A measurement mark block may be formed on the chip peripheral region, in the same manner as in the conventional case. Alternatively, measurement mark blocks 2 and a measurement mark 13 may be included only in the mega-cells 1 and primitive cell 3, respectively, and be dispersedly placed in the LSI pattern of the inner chip region.

Figure 5:
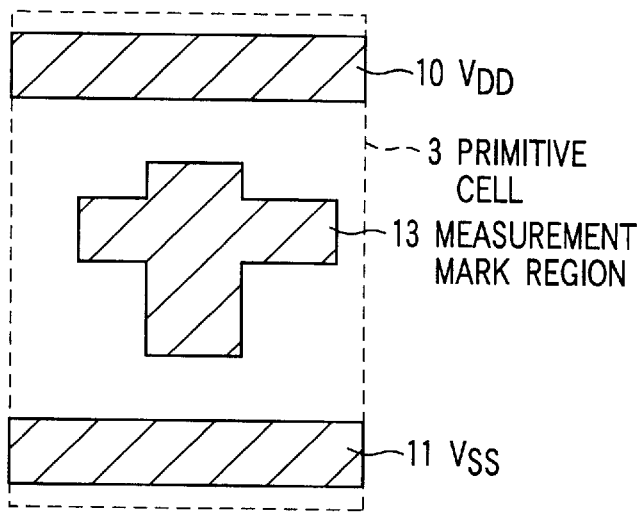
FIG. 5 is a view showing a primitive cell including an independent measurement mark according to the fourth embodiment of the present invention.

A method of placing marks for alignment accuracy measurement according to the fourth embodiment of the present invention will be described with reference to FIG. 5. In the fourth embodiment, a measurement mark 13 identical to that described in the second and third embodiments is added as an independent primitive cell to the constituent elements of the cell library, and LSI pattern design is performed by using automatic placing and routing CAD.

With this method, the independent primitive cells comprising the measurement mark 13 are automatically and dispersedly placed in open spaces in the inner chip region of the LSI. As a result, the measurement marks can be included in the LSI pattern in the inner chip region without excessively decreasing the integration density of the entire LSI.

Figure 6:
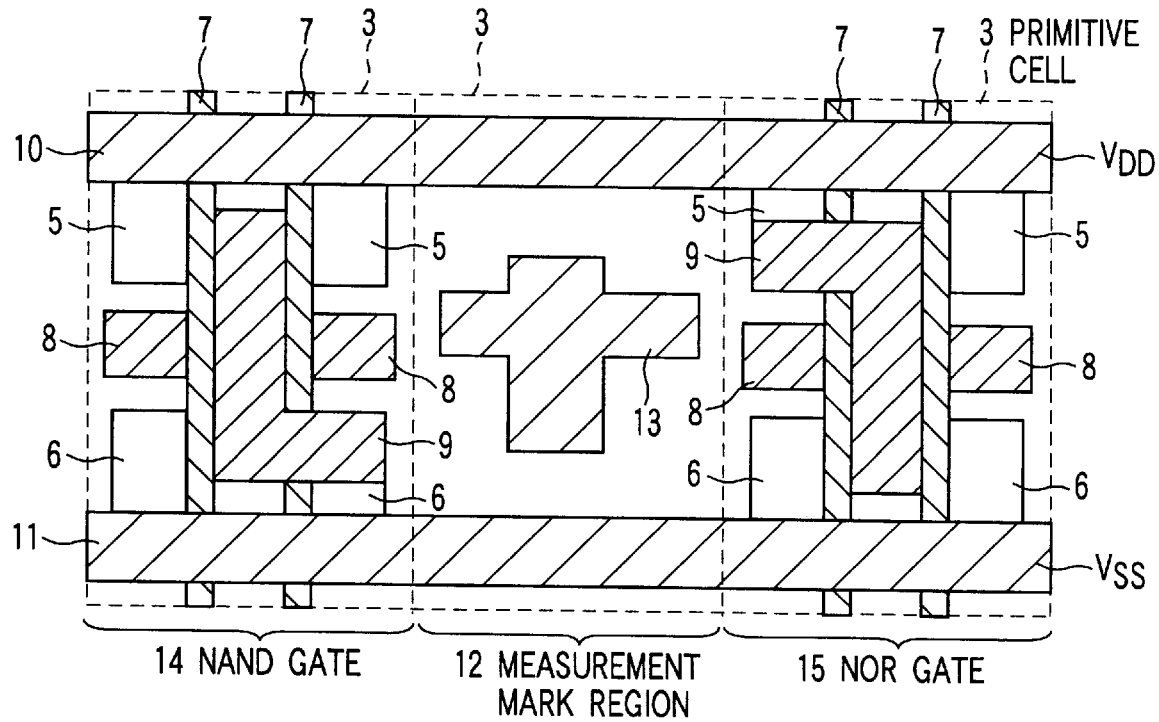
FIG. 6 is a view showing a state wherein the primitive cell including the independent measurement mark according to the fourth embodiment is placed between the primitive cells of a NAND gate and NOR gate.

The independent primitive cell comprising the measurement mark 13 includes a $V_{DD}$ power source metallization 10 and a $V_{SS}$ power source metallization 11. As shown in FIG. 6, the $V_{DD}$ power source metallization 10 and $V_{SS}$ power source metallization 11 are connected in series to the corresponding power source metallizations of a NAND gate 14 and NOR gate 15 that are adjacent to each other. As a result, automatic routing design of the LSI pattern can be performed smoothly.

Note that it is also possible to use an independent primitive cell comprising only a measurement mark 13 from which a $V_{DD}$ power source metallization 10 and a $V_{SS}$ power source metallization 11 are removed, and to connect the power source metallization within the algorithm (program language) of automatic placing and routing CAD.

A method of placing marks for alignment accuracy measurement according to the fifth embodiment of the present invention will be described with reference to FIG. 7. A silicon chip 19 shown in FIG. 7 comprises an inner chip region 17 and a chip peripheral region including I/O region 18. The inner chip region 17 is constituted by mega-cells 1 and a primitive cell region 16 where a large number of primitive cells are arranged regularly. Measurement mark blocks 2 are placed on the mega-cells 1. Each independent measurement mark region 12 is one of the constituent elements of the cell library described in the fourth embodiment.

The mega-cells 1 are placed on the inner chip region 17 by using automatic placing and routing CAD, and logic gates and independent measurement mark regions serving as the constituent elements of the cell library are placed on the primitive cell region 16. As a result, the measurement mark blocks 2 and independent measurement mark regions 12 are dispersedly placed in the inner chip region. FIG. 7 shows this concept. With this method, the measurement marks can be automatically placed in the mega-cell regions reliably and the primitive cell region at a certain ratio.

Figure 7:
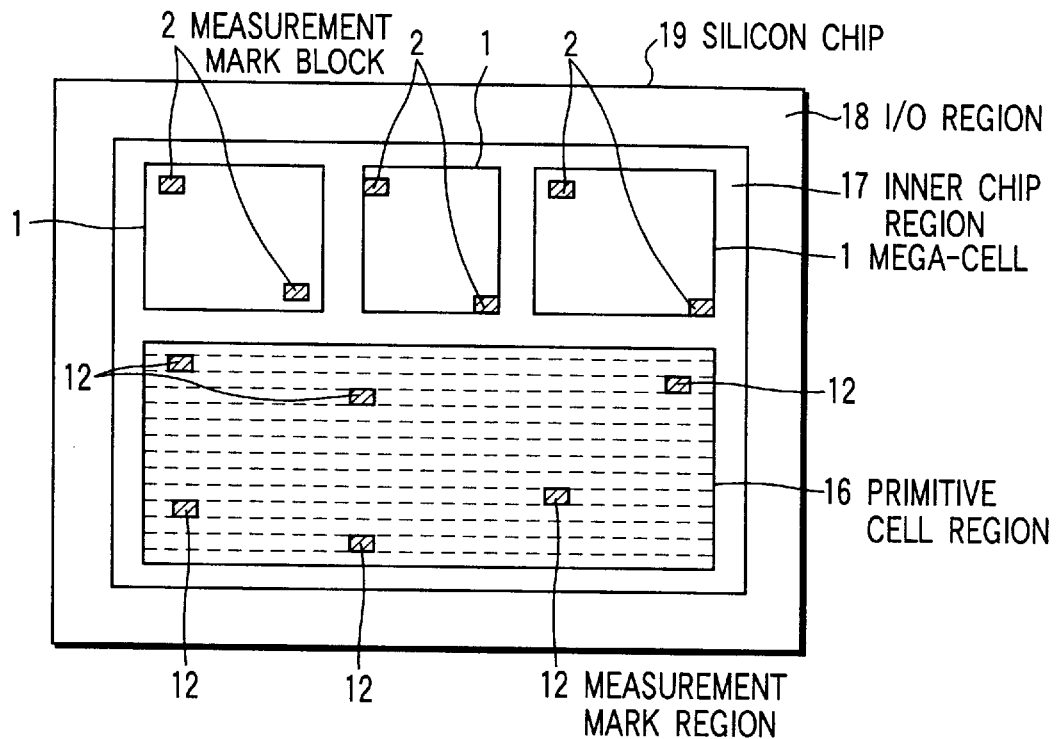
FIG. 7 is a view showing a state wherein measurement marks are placed in a mixed primitive cell LSI of mega-cell system according to the fifth embodiment of the present invention.

In the silicon chip 19 shown in FIG. 7, the formation region of the mega-cells 1 and the formation region of the primitive cell region 16 are separated and regularly arranged. In the mixed primitive cell LSI of mega-cell system, the formation region of the mega-cells 1 and the formation region of the primitive cell region 16 need not always be separated from each other in this manner. The primitive cell region 16 can be formed to surround the plurality of mega-cells 1, and the primitive cell region 16 can constitute the peripheral logic circuit of the mega-cells 1. In this case as well, with the method according to the fifth embodiment, the measurement mark blocks 2 and independent measurement mark regions 12 are dispersedly placed in the inner chip region, as a matter of course.

A measurement mark block may be formed on the chip peripheral region, in the same manner as in the conventional case. Alternatively, measurement mark blocks 2 and a measurement mark 13 may be included only in the mega-cells 1 and primitive cells 3, respectively, and be dispersedly placed in the LSI pattern of the inner chip region. Also, only either the measurement mark blocks 2 or a measurement mark 13 may be formed.

Correspondence between the cell pattern, used in the above embodiments, of the inverter 4 comprising the CMOS circuit, the NAND gate 14, and the NOR gate 15, and its circuit configuration will be described with reference to the accompanying drawing.

Figure 8A:
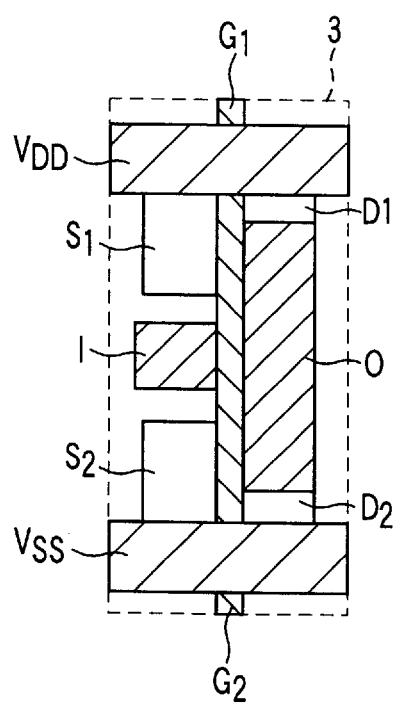
FIGS. 8A and 8B are a view showing the primitive cell pattern of an inverter and its circuit diagram in correspondence, respectively.
Figure 8B:
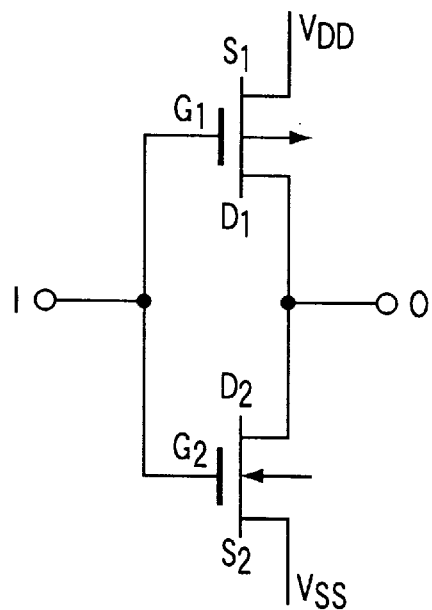

FIG. 8A shows the cell pattern of the inverter formed in the primitive cell 3, and FIG. 8B is a corresponding circuit diagram. Reference symbols $S_1$ and $S_2$, $D_1$ and $D_2$, and $G_1$ and $G_2$ denote the sources, drains, and gates, respectively, of p- and n-channel type MOS transistors. Reference symbols I and O denote input and output portions, respectively; and $V_{DD}$ and $V_{SS}$, the power sources of the CMOS circuits.

Figure 9A:
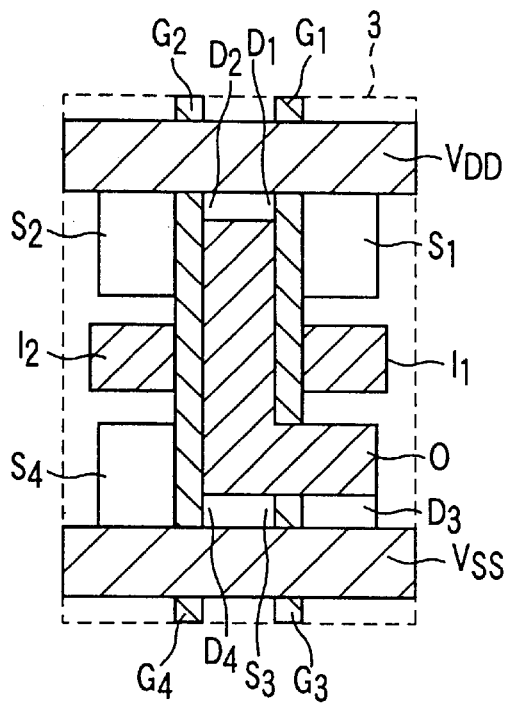
FIGS. 9A and 9B are a view showing the primitive cell pattern of a two-input NAND gate and its circuit diagram in correspondence, respectively.
Figure 9B:
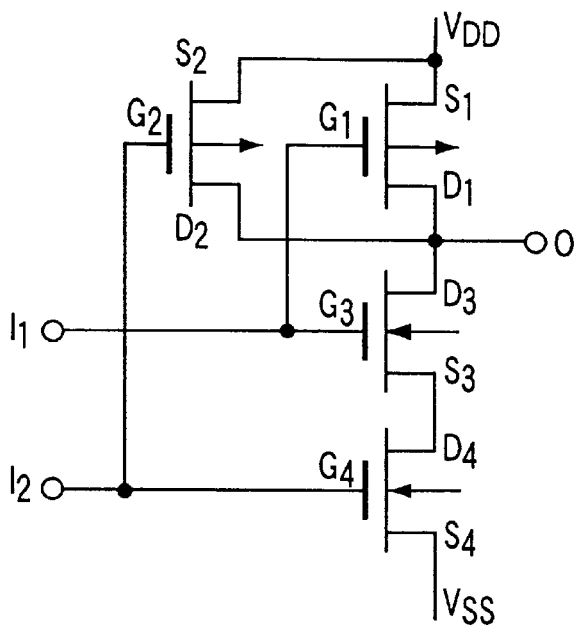

FIG. 9A shows the cell pattern of a 2-input NAND gate formed in the primitive cell 3, and FIG. 9B is a corresponding circuit diagram. Reference symbols $S_1$ and $S_2$, $D_1$ and $D_2$, and $G_1$ and $G_2$ denote the sources, drains, and gates, respectively, of p-channel type MOS transistors; and $S_3$ and $S_4$, $D_3$ and $D_4$, and $G_3$ and $G_4$, the sources, drains, and gates, respectively, of n-channel type MOS transistors. Reference symbols $I_1$ and $I_2$ denote input portions. Reference symbol O denotes an output portion; and $V_{DD}$ and $V_{SS}$, the power sources of the CMOS circuits.

Figure 10A:
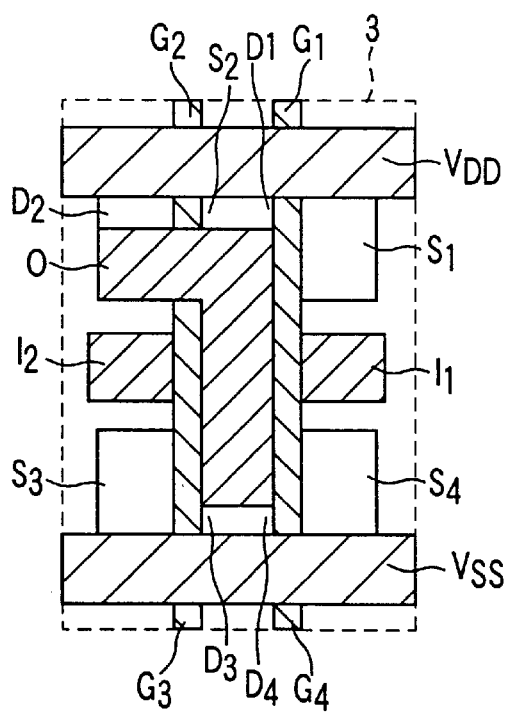
FIGS. 10A and 10B are a view showing the primitive cell pattern of a two-input NOR gate and its circuit diagram in correspondence, respectively.
Figure 10B:
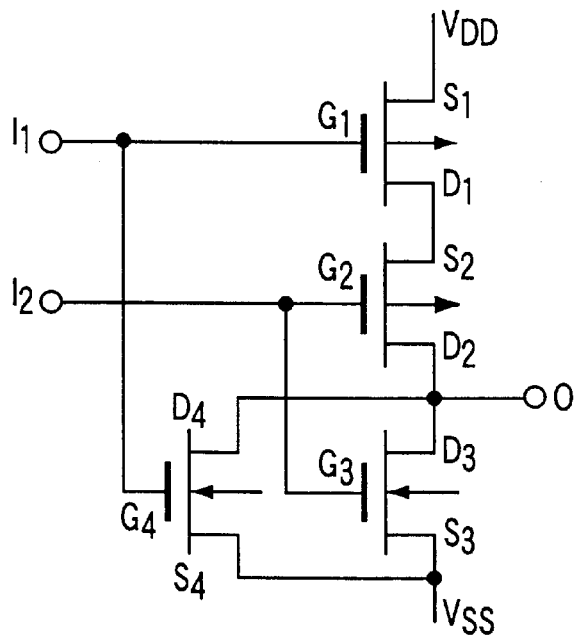

FIG. 10A shows the cell pattern of a 2-input NOR gate formed in the primitive cell 3, and FIG. 10B is a corresponding circuit diagram. Reference symbols $S_1$ and $S_2$, $D_1$ and $D_2$, and $G_1$ and $G_2$ denote the sources, drains, and gates, respectively, of p-channel type MOS transistors; and $S_3$ and $S_4$, $D_3$ and $D_4$, and $G_3$ and $G_4$, the sources, drains, and gates, respectively, of n-channel type MOS transistors. Reference symbols $I_1$ and $I_2$ denote input portions. Reference symbol O denotes an output portion; and $V_{DD}$ and $V_{SS}$, the power sources of the CMOS circuits.

The present invention is not limited to the above embodiments. In the above embodiments, a method of placing and adding marks for alignment accuracy measurement is described by way of an LSI comprising a CMOS circuit. However, the present invention also covers an LSI pattern where measurement marks are placed in accordance with this placing method.

The method of placing and adding marks for alignment accuracy measurement according to the present invention, and the LSI pattern formed by using it can similarly be applied to an LSI comprising n- or p-MOS circuits. The present invention is not limited to a MOS LSI but can also be applied to an LSI comprising bipolar transistors or an LSI comprising BiCMOS circuits mixedly having bipolar transistors and CMOS circuits. Various changes and modifications may be made without departing from the spirit and scope of the invention.

As has been described above, with the method of placing marks for alignment accuracy measurement according to the present invention, errors caused by a human factor upon placing or adding measurement marks by a manual operation can be avoided, and desired measurement marks can be automatically, dispersedly placed in an inner chip region by employing the conventional automatic placing and routing CAD, without creating new CAD or adding or altering CAD.

In this manner, when the method of placing and adding marks for alignment accuracy measurement in an LSI chip, in which the man-machine interactive operation is excluded and standardization of dimensional accuracy measurement and positioning accuracy measurement is facilitated, is employed, the development time is shortened, and an LSI having a high yield and high reliability can be manufactured at a low cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. In creating a pattern layout of an LSI including at least one mega-cell placed in an inner region of a semiconductor chip and a peripheral region of said semiconductor chip, a method of placing marks for alignment accuracy measurement, comprising the steps of:

placing, in said mega-cell, a measurement mark for measuring at least one of pattern dimensional accuracy and pattern positioning accuracy;

adding said mega-cell to said inner region of said semiconductor chip; and automatically placing said mega-cell in said inner region of said semiconductor chip by automatic placing and routing means.

2. In creating a pattern layout of an LSI including a plurality of primitive cells comprising several types of gate circuits placed in an inner region of a semiconductor chip and a peripheral region of said semiconductor chip, a method of placing marks for alignment accuracy measurement, comprising the steps of:

placing a measurement mark for measuring at least one of pattern dimensional accuracy and pattern positioning accuracy, in a primitive cell comprising at least one type of gate circuit among said several types of gate circuits;

adding said primitive cell to said inner region of said semiconductor chip; and automatically placing said primitive cell in said inner region of said semiconductor chip by automatic placing and routing means.

3. A method according to claim 2, wherein a region in said primitive cell where said measurement mark is to be placed is adjacent to a circuit pattern that forms said gate circuit and is placed among a plurality of power source metallization patterns of said gate circuit.

4. In creating a pattern layout of an LSI including at least one mega-cell placed in an inner region of a semiconductor chip, a plurality of primitive cells comprising several types of gate circuits placed in said inner region of said semiconductor chip, and a peripheral region of said semiconductor chip, a method of placing marks for alignment accuracy measurement, comprising the steps of:

placing, in said mega-cell, a first measurement mark for measuring at least one of pattern dimensional accuracy and pattern positioning accuracy;

placing a second measurement mark for measuring at least one of pattern dimensional accuracy and pattern positioning accuracy, in a primitive cell comprising at least one type of gate circuit among said several types of gate circuits; and adding said mega-cell and said primitive cell to said inner region of said semiconductor chip and automatically placing said primitive cell and said mega-cell in said inner region of said semiconductor chip by automatic placing and routing means.

5. A method according to claim 4, wherein a region in said primitive cell where said second measurement mark is to be placed is adjacent to a circuit pattern that forms said gate circuit and is placed among a plurality of power source metallization patterns of said gate circuit.

6. In creating a pattern layout of an LSI including a plurality of primitive cells comprising several types of gate circuits placed in an inner region of a semiconductor chip and a peripheral region of said semiconductor chip, a method of placing marks for alignment accuracy measurement, comprising the steps of:

defining a measurement mark for measuring at least one of pattern dimensional accuracy and pattern positioning accuracy, as one independent primitive cell in automatic placing and routing means;

adding said independent primitive cell to said inner region of said semiconductor chip; and automatically placing said independent primitive cell and said plurality of primitive cells in said inner region of said semiconductor chip by said automatic placing and routing means.

7. A method according to claim 6, wherein metallization patterns to be connected to a plurality of power source metallization patterns of said several types of gate circuits are included in said independent primitive cell comprising said measurement mark, and said measurement mark is placed among said metallization patterns.

8. In creating a pattern layout of an LSI including at least one mega-cell placed in an inner region of a semiconductor chip, a plurality of primitive cells comprising several types of gate circuits placed in said inner region of said semiconductor chip, and a peripheral region of said semiconductor chip, a method of placing marks for alignment accuracy measurement, comprising the steps of:

placing, in said mega-cell, a first measurement mark for measuring at least one of pattern dimensional accuracy and pattern positioning accuracy;

adding said mega-cell to said inner region of said semiconductor chip; and adding a second measurement mark for measuring at least one of pattern dimensional accuracy and pattern positioning accuracy to said inner region of said semiconductor chip as one independent primitive cell in automatic placing and routing means and automatically placing said independent primitive cell, said plurality of primitive cells, and said mega-cell in said inner region of said semiconductor chip by automatic placing and routing means.

9. A method according to claim 8, wherein metallization patterns to be connected to a plurality of power source metallization patterns of said several types of gate circuits are included in said independent primitive cell comprising said second measurement mark, and said measurement mark is placed among said metallization patterns.

10. In creating a pattern layout of an LSI including a plurality of primitive cells comprising several types of gate circuits, a peripheral region of a semiconductor chip, and a measurement mark for measuring at least one of pattern dimensional accuracy and pattern positioning accuracy in an inner region of said semiconductor chip, a method of adding marks for alignment accuracy measurement, comprising the steps of:

defining said measurement mark for measuring at least one of pattern dimensional accuracy and pattern positioning accuracy, as one independent primitive cell in automatic placing and routing means;

adding said independent primitive cell is added to said inner region of said semiconductor chip; and automatically placing said independent primitive cell and said plurality of primitive cells in said inner region of said semiconductor chip by said automatic placing and routing means, thereby adding said measurement mark for measuring at least one of pattern dimensional accuracy and pattern positioning accuracy to said pattern layout of said LSI.

11. A method according to claim 10, wherein metallization patterns to be connected to a plurality of power source metallization patterns of said several types of gate circuits are included in said independent primitive cell comprising said measurement mark, and said measurement mark is placed among said metallization patterns.

12. In creating a pattern layout of an LSI including at least one mega-cell placed in an inner region of a semiconductor chip, a plurality of primitive cells comprising several types of gate circuits placed in said inner region of said semiconductor chip, a peripheral region of said semiconductor chip, and a measurement mark for measuring at least one of pattern dimensional accuracy and pattern positioning accuracy, a method of adding marks for alignment accuracy measurement, comprising the steps of:

placing, in said mega-cell, a first measurement mark for measuring at least one of pattern dimensional accuracy and pattern positioning accuracy;

adding said mega-cell to said inner region of said semiconductor chip, and adding a second measurement mark for measuring at least one of pattern dimensional accuracy and pattern positioning accuracy to said inner region of said semiconductor chip as one independent primitive cell in automatic placing and routing means and automatically placing said independent primitive cell, said plurality of primitive cells, and said mega-cell in said inner region of said semiconductor chip by using automatic placing and routing means, thereby adding said measurement mark for measuring at least one of pattern dimensional accuracy and pattern positioning accuracy to said pattern layout of said LSI.

13. A method according to claim 12, wherein metallization patterns to be connected to a plurality of power source metallization patterns of said several types of gate circuits are included in said independent primitive cell comprising said second measurement mark, and said measurement mark is placed among said metallization patterns.

14. In creating a pattern layout of an LSI including at least one mega-cell placed in an inner region of a semiconductor chip and a peripheral region of said semiconductor chip, an LSI pattern wherein a measurement mark for measuring at least one of pattern dimensional accuracy and pattern positioning accuracy is placed in said mega-cell, said mega-cell is added to said inner region of said semiconductor chip, and said mega-cell is automatically placed in said inner region of said semiconductor chip by using automatic placing and routing means, thereby adding said measurement mark to said inner region of said semiconductor chip.

15. In creating a pattern layout of an LSI including a plurality of primitive cells comprising several types of gate circuits placed in an inner region of a semiconductor chip, and a peripheral region of said semiconductor chip, an LSI pattern wherein a measurement mark for measuring at least one of pattern dimensional accuracy and pattern positioning accuracy is placed in a primitive cell comprising at least one type of gate circuit among said several types of gate circuits, said primitive cell is added to said inner region of said semiconductor chip, and said primitive cell is automatically placed in said inner region of said semiconductor chip by using automatic placing and routing means, thereby adding said measurement mark to said inner region of said semiconductor chip.

16. In creating a pattern layout of an LSI including at least one mega-cell placed in an inner region of a semiconductor chip, a plurality of primitive cells comprising several types of gate circuits placed in said inner region of said semiconductor chip, and a peripheral region of said semiconductor chip, an LSI pattern wherein a first measurement mark for measuring at least one of pattern dimensional accuracy and pattern positioning accuracy is placed in said mega-cell, a second measurement mark for measuring at least one of pattern dimensional accuracy and pattern positioning accuracy is placed in a primitive cell comprising at least one type of gate circuit among said several types of gate circuits, and said mega-cell and said primitive cell are added to said inner region of said semiconductor chip, and said primitive cell and said mega-cell are automatically placed in said inner region of said semiconductor chip by using automatic placing and routing means, thereby adding said first and second measurement marks to said inner region of said semiconductor chip.

17. In creating a pattern layout of an LSI including a plurality of primitive cells comprising several types of gate circuits placed in an inner region of a semiconductor chip, and a peripheral region of said semiconductor chip, an LSI pattern wherein a measurement mark for measuring at least one of pattern dimensional accuracy and pattern positioning accuracy is defined as one independent primitive cell in automatic placing and routing means, said independent primitive cell is added to said inner region of said semiconductor chip, and said independent primitive cell and said plurality of primitive cells are automatically placed in said inner region of said semiconductor chip by using said automatic placing and routing means, thereby adding said measurement mark to said inner region of said semiconductor chip.

18. In creating a pattern layout of an LSI including at least one mega-cell placed in an inner region of a semiconductor chip, a plurality of primitive cells comprising several types of gate circuits placed in an inner region of a semiconductor chip, and a peripheral region of said semiconductor chip, an LSI pattern wherein a first measurement mark for measuring at least one of pattern dimensional accuracy and pattern positioning accuracy is placed in said mega-cell, said mega-cell is added to said inner region of said semiconductor chip, and a second measurement mark for measuring at least one of pattern dimensional accuracy and pattern positioning accuracy is added to said inner region of said semiconductor chip as one independent primitive cell in automatic placing and routing means, and said independent primitive cell, said plurality of primitive cells, and said mega-cell are automatically placed in said inner region of said semiconductor chip by using said automatic placing and routing means, thereby adding said first and second measurement marks to said inner region of said semiconductor chip.

* * * * *